(12) United States Patent
Thyssen

(10) Patent No.: US 7,164,719 B2
(45) Date of Patent: Jan. 16, 2007

(54) SYSTEM TO REDUCE DISTORTION DUE TO CODING WITH A SAMPLE-BY-SAMPLE QUANTIZER

(75) Inventor: Jes Thyssen, Laguna Niguel, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 1057 days.

(21) Appl. No.: 09/733,567

(22) Filed: Dec. 8, 2000

(65) Prior Publication Data

US 2002/0106028 A1   Aug. 8, 2002

(51) Int. Cl.
*H04B 14/04* (2006.01)

(52) U.S. Cl. .............. 375/243; 375/240.03; 375/240.27
(58) Field of Classification Search ......... 375/240–243; 704/200.1, 268; 382/246; 370/525; 348/619; 341/118
See application file for complete search history.

(56) References Cited

U.S. PATENT DOCUMENTS

| 4,467,346 A | | 8/1984 | Mori |
| 4,680,758 A | * | 7/1987 | Kumazaki et al. .......... 370/525 |
| 5,959,562 A | | 9/1999 | Wiesbauer |

* cited by examiner

*Primary Examiner*—Stephen Chin
*Assistant Examiner*—Curtis Odom
(74) *Attorney, Agent, or Firm*—Farjami & Farjami LLP (57) ABSTRACT

A distortion removal system for reducing the quantization distortion that results from quantization of a signal by sample-by-sample quantization techniques is disclosed. The distortion removal system uses the signal previously quantized with the sample-by-sample quantization techniques to determine an expected quantization distortion. The expected quantization distortion is determined for each of a plurality of frames of the signal. The expected quantization distortion is removed from each of the frames of the signal.

43 Claims, 7 Drawing Sheets

SYSTEM TO REDUCE DISTORTION DUE TO CODING WITH A SAMPLE-BY-SAMPLE QUANTIZER

BACKGROUND OF THE INVENTION

1. Technical Field

This invention relates to signal communication systems and, more particularly, to the reduction of quantization noise in digital signal compression.

2. Related Art

One prevalent mode of human communication uses communication systems. Communication systems include both wireline and wireless radio based systems. Wireless communication systems are electrically connected with wireline based systems to form a communication network. One form of communication within the communication network is digital transmission of signals such as speech, audio etc. Digital transmission may involve the steps of: sampling an analog waveform with an analog-to-digital converter, compression (encoding), transmission, decompression (decoding) and digital-to-analog conversion to synthesize the analog waveform. Compression involves minimizing the number of bits used to encode the signal in an effort to maximize the available bandwidth within the communication systems.

One coding technique involves the use of quantizers that perform sample-by-sample quantization of the signal. The signal may be divided into discrete samples to facilitate encoding and decoding. The samples may be further processed to obtain parameter values representing the samples. In general, quantization involves using a table of quantization levels that are selectively chosen to represent the parameter values. Selection of the quantization levels is based on minimizing the error between the parameter values and the quantization levels during a series of quantizations. Sample-by-sample quantization typically occurs in an encoder in order to compress the signal for transmission. Following transmission, the decoder uses the same table of quantization levels to reconstruct the signal. The encoding and decoding of a signal may occur many times within the communication systems.

A known problem in sample-by-sample quantization is the introduction of audible distortion known as quantization distortion at "low" bits-rates. A signal that is compressed with A-law or μ-law as described in the digital speech coding standard G.711 is one example of sample-by-sample quantization that introduces quantization distortion into the signal. Consequently, a signal that has been encoded and decoded with G.711 may contain undesirable audible quantization noise, thereby reducing the perceptual quality. Accordingly, a need exists for systems of reducing the quantization distortion introduced during sample-by-sample quantization.

SUMMARY

This invention provides a distortion removal system for reducing quantization distortion created by a sample-by-sample quantizer. The distortion removal system determines an expected quantization distortion for a frame of the signal. Through analysis of samples that form the frame, the distortion removal system determines the expected quantization distortion for each sample. The expected quantization distortion for each of the samples are summed to obtain the expected quantization distortion for the frame. The expected quantization distortion may then be removed from the frame using known techniques from the field of noise suppression.

The expected quantization distortion may be estimated for each of a plurality of quantization levels associated with the sample-by-sample quantizer. Estimation of the expected quantization distortion may be accomplished by determining the distribution of a plurality of samples that are quantized to a particular quantization level. In one embodiment, the expected quantization distortion may be estimated and stored in a distortion table. The distortion table may be used to identify the expected quantization distortion associated with each quantization level present in a signal previously subject to quantization.

The distortion removal system provides reduction of the quantization distortion introduced by sample-by-sample quantization. The distortion removal system may use the signal that was previously quantized to estimate and remove quantization distortion. Accordingly, the distortion removal system may be implemented as a post-processing module or a pre-processing module within communication equipment without changes to the existing processing of encoders, decoders and other processes within the communication equipment. Any coarse sample-by-sample quantization technique may use the distortion removal system to reduce quantization distortion and provide a better approximation of the original signal. Improvement by the distortion removal system of the quality of signals subject to sample-by-sample quantization may occur anywhere in the communication system.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principals of the invention. Moreover, in the figures, like reference numerals designate corresponding parts throughout the different views.

DETAILED DESCRIPTION OF THE PREFERRED EMBODIMENTS

Embodiments of a distortion removal system performing detection and reduction of quantization distortion from a reconstructed signal are disclosed. Detection of the presence of quantization distortion in the reconstructed signal involves identifying reconstructed signals that were previously quantized by a sample-by-sample quantizer. Removal of the quantization distortion involves the estimation and storage of the expected quantization distortion in a table. Using the table, a frame of the reconstructed signal may be analyzed to determine the expected quantization distortion for the frame. The expected quantization distortion may then be removed from the frame to provide a closer estimation of the signal, as it existed prior to the sample-by-sample quantization.

Figure 1:
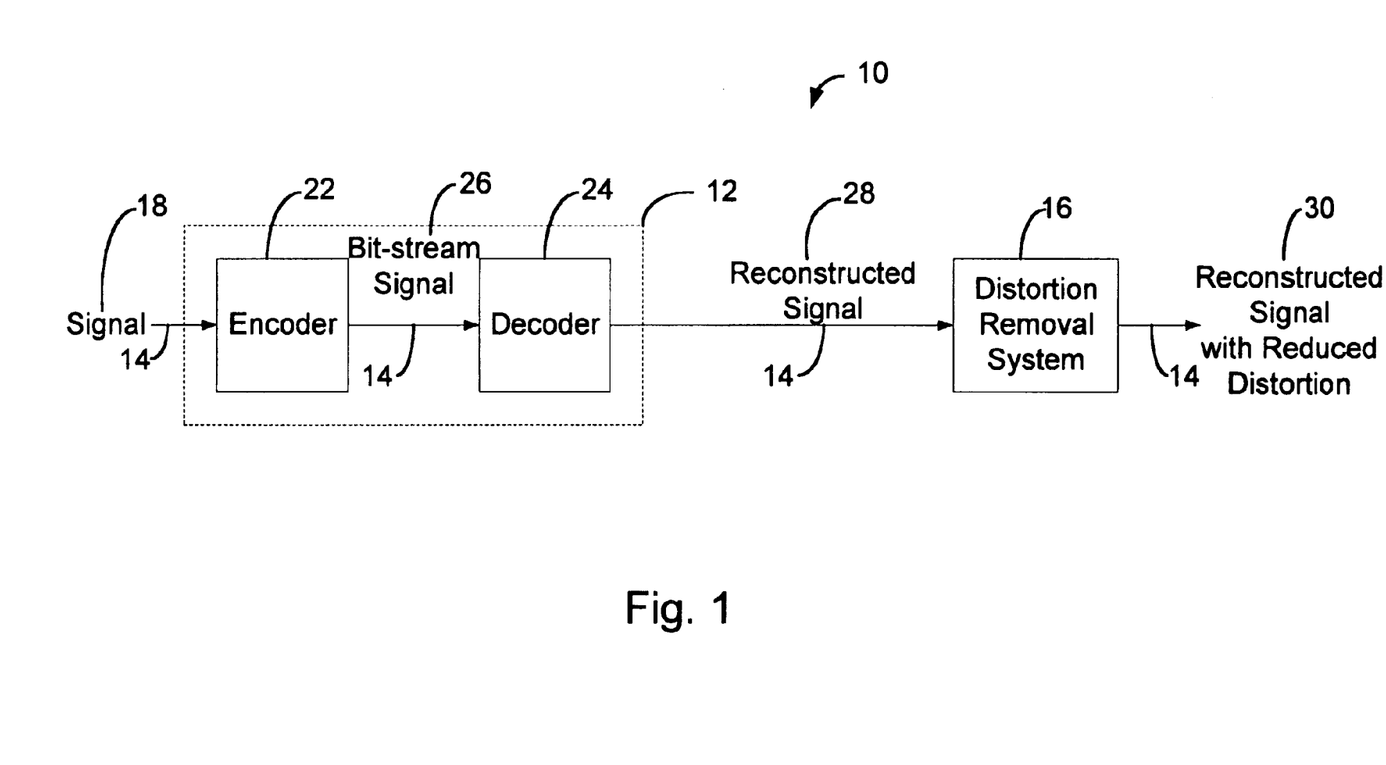
FIG. 1 is a block diagram of a portion of a communication system illustrating one embodiment of a distortion removal system.

FIG. 1 is a block diagram of one example embodiment of a portion of a communication system 10. The communication system 10 includes a coder 12, a communication medium 14 and a distortion removal system 16 that may be connected as illustrated. The communication system 10 may include wireless communication systems and wireline communication systems. Further, the wireless and wireline communication systems may include packet-based networks, such as, a Voice over Internet Protocol (VoIP) network. In a typical communication system 10, the wireless communication systems are electrically connected with public switched telephone networks (PSTNs) included in the wireline systems. The wireless communication systems typically include a plurality of base stations to provide radio communication with mobile communication devices, such as a cellular telephone or a portable radio transceiver. Wireline communication systems may use central offices and other wireline communication devices for communication in both digital and analog form.

A signal 18 may originate within the wireless communication system or the wireline communication system. The signal 18 may be any sound, such as a speech signal, an audio signal, background noise, silence or any other sound capable of transmission within the communication system 10. Transmission of the signal 18 within the communication system 10 may occur using the communication medium 14.

The communication medium 14 may be any transmission mechanism, such as a communication channel, radio waves, microwave, wire transmissions, fiber optic transmissions, or any other medium. The communication medium 14 may also include transmitting devices and receiving devices. An example embodiment of the communication medium 14 may include communication channels, antennas and associated transceivers for radio communication in a wireless communication system.

In the example embodiment illustrated in FIG. 1, the signal 18 may be processed through the coder 12. The coder 12 includes an encoder 22 in communication with a decoder 24 via the communication medium 14. The signal 18 originating from a sender (not shown) is typically encoded for transmission and subsequently decoded prior to receipt by the intended recipient of the signal 18. Encoding and decoding of the signal 18 may occur multiple times as the signal 18 is transmitted through the wireless communication system and/or the wireline communication system. The encoder 22 and the decoder 24 may, for example, be located within a mobile communication device, a base station, a PSTN or any other location within the wireless and wireline communication systems. Encoding and decoding may be as simple as analog to digital conversion of the signal 18 or may involve more complex processing such as, signal compression, perceptual quality improvement or other signal manipulation techniques to facilitate transmission.

In general, the encoder 22 receives and encodes the signal 18 to form a bit-stream signal 26. The decoder 24 receives and decodes the bit-stream signal 26 to create a reconstructed signal 28. The reconstructed signal 28 may include distortion referred to as quantization distortion or quantization noise. The quantization distortion may be characterized as a stochastic or random variable that introduces audible distortion to the reconstructed signal 28. Sample-by-sample quantization of the signal 18 may create the quantization distortion. The encoder 22 may include a sample-by-sample quantizer, as will be later discussed, to perform sample-by-sample quantization. The distortion removal system 16 is operable to remove quantization distortion introduced by sample-by-sample quantization.

The distortion removal system 16 may receive and utilized the reconstructed signal 28 to estimate an expected quantization distortion. The expected quantization distortion may be removed by the distortion removal system 16 from the reconstructed signal 28 to form a reconstructed signal with reduced distortion 30. The reconstructed signal with reduced distortion 30 may more closely resemble the signal 18 prior to encoding.

One or more occurrences of the distortion removal system 16 may be located anywhere within the communication system 10. In one embodiment, the distortion removal system 16 may be a pre-processing module within a mobile communication device, a base station, a public switched telephone network (PSTN) or any other communication equipment within the communication system 10. The distortion removal system 16 of this embodiment is operable to determine if a sample-by-sample quantizer previously quantized the reconstructed signal 28. If so, the distortion removal system 16 may remove the expected quantization distortion. Reconstructed signals 28 not previously quantized by a sample-by-sample quantizer may be passed through the distortion removal system 16 to the communication equipment without further processing.

In an alternative embodiment, the distortion removal system 16 may be a post-processing module for a coder 12 within the communication system 10. In this embodiment, the coder 12 may include a sample-by-sample quantizer. As such, signals 18 that are encoded and subsequently decoded by the coder 12 may be processed through the distortion removal system 16 to remove the expected quantization distortion. Since the distortion removal system 16 of the previously discussed embodiments operates using the reconstructed signal 28, no changes to existing encoding and decoding processing is required.

Figure 2:
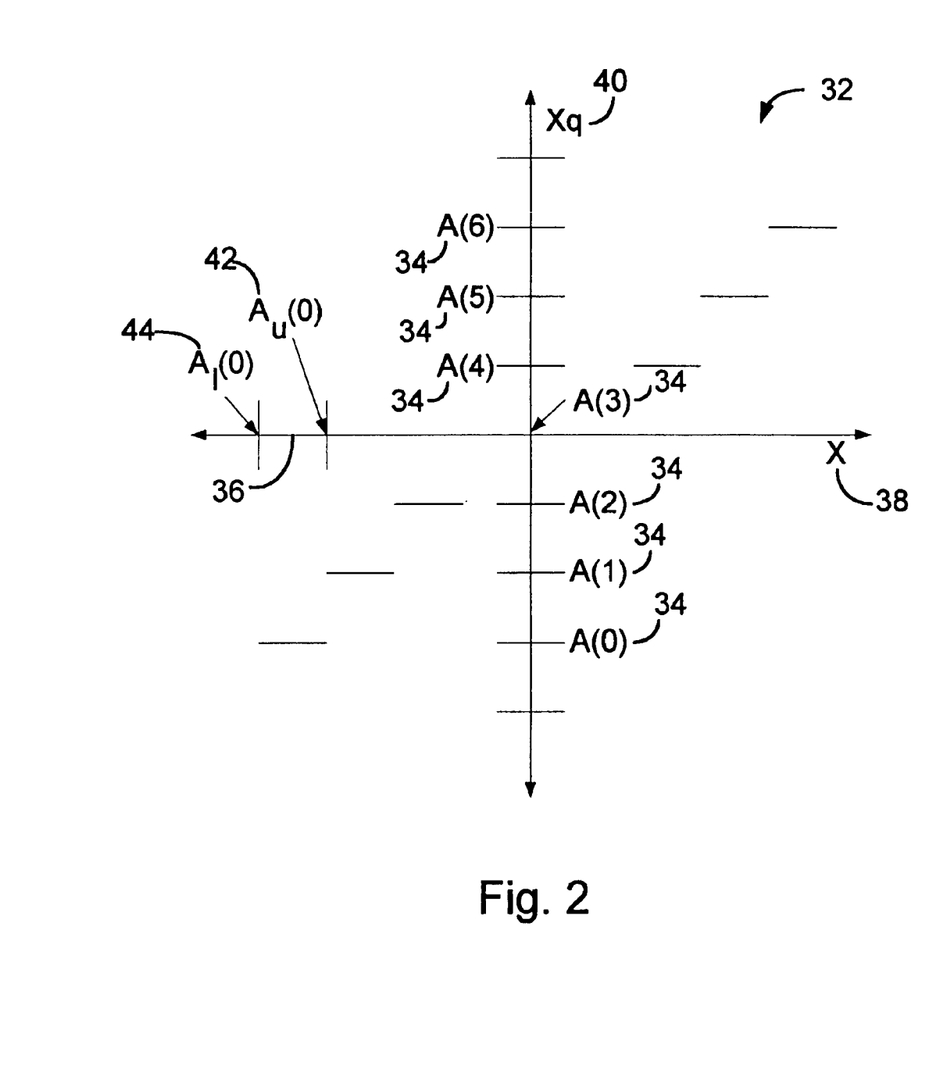
FIG. 2 is an X-Y graph illustrating the operation of a sample-by-sample quantizer in one embodiment.

FIG. 2 illustrates the operation of an example embodiment of a sample-by-sample quantizer 32. The sample-by-sample quantizer 32 includes a plurality of quantization levels A(i) 34 (where "i" represents a particular quantization level) and a plurality of quantization intervals 36. An example of a sample-by-sample quantizer is the A-law and μ-law sample-by-sample quantizer described in the digital speech coding standard G.711.

The quantization levels A(i) 34 and corresponding quantization intervals 36 may comprise any number of levels and is not limited to those illustrated in FIG. 2. The sample-by-sample quantizer 32 is operable to separate the signal 18 into a plurality of frames (not shown), each representing a predetermined portion of the signal 18. The frames are further reduced to a plurality of samples (x) 38, each representing a predetermined portion of one of the frames.

Operation of the sample-by-sample quantizer 32 may be illustrated using a two dimensional X-Y graph as depicted in FIG. 2. The X axis represents the samples (x) 38 and the Y axis represents a plurality of quantized samples ($x_q$) 40. In this embodiment, the sample-by-sample quantizer 32 quantizes each of the samples (x) 38 to one of the quantization levels A(i) 34. Each of the quantization levels A(i) 34 is an index location that may be identified by the sample-by-sample quantizer 32 as known in the art. The samples (x) 38 may be quantized to the "nearest" quantization level A(i) 34. In other words, the quantization level A(i) 34 nearest in value to the particular sample (x) 38 represents the particular quantized sample $(x_q)$ 40. In one example embodiment, quantization to the nearest quantization level A(i) 34 by the sample-by-sample quantizer 32 may utilize a mean square error (MSE) measure.

A number of samples (x) 38 quantized to one of the quantization levels A(i) 34 falls within the quantization interval 36. The distribution of the samples (x) 38 within the quantization interval 36 may be represented with that particular quantization level A(i) 34. Each of the quantization intervals 36 includes an upper boundary $A_u(i)$ 42 and a lower boundary $A_l(i)$ 44. The upper and lower boundaries 42 and 44 identify the minimum and maximum values of the samples (x) 38 that may be quantized to that particular quantization level A(i) 34. In the example illustrated in FIG. 2, the upper and lower boundaries 42 and 44 are associated with the particular quantization level A(i) 34 identified as "A(0)." In one embodiment, the samples (x) 38 may be assumed to be uniformly distributed within the quantization interval 36 and may be represented as:

$$x(i) \in U[A_l(i); A_u(i)], \quad \text{Equation 1}$$

where i denotes the particular quantization level A(i) 34. Accordingly, the probability density function of the samples (x) 38 within a particular quantization interval 36 is given by:

$$f(x(i)) = \begin{cases} \frac{1}{A_u(i) - A_l(i)}, & \text{for } A_l(i) < x(i) < A_u(i) \\ 0, & \text{otherwise.} \end{cases} \quad \text{Equation 2}$$

In alternative embodiments, other distributions of the samples (x) 38 within the quantization intervals 36 may be assumed in order to most appropriately reflect the particular alternative embodiment. The estimated distribution may also be determined empirically or using some other statistical method as known in the art.

The upper and lower boundaries 42 and 44 may generally be determined by the error criterion applied by the sample-by-sample quantizer 32. In one embodiment, the encoder 12 may use the mean square error (MSE) criterion or the G.711 error criterion. Determination of the upper boundary $A_u(i)$ 42 for sample-by-sample quantizers 32 that use the nearest quantization level A(i) 34 to quantize the samples (x) 38 may be represented by:

$$A_u(i) = \frac{[A(i) + A(i+1)]}{2}. \quad \text{Equation 3}$$

Similarly, the lower boundary $A_l(i)$ 44 may be determined by:

$$A_l(i) = \frac{[A(i-1) + A(i)]}{2}. \quad \text{Equation 4}$$

In alternative embodiments that utilize a different error criterion, the upper and lower boundaries 42 and 44 may be determined differently. The error criterion used in encoding the signal 18 may be used to calculate the upper and lower boundaries 42 and 44.

The difference between the samples (x) 38 and the quantization level A(i) 34 that each of the samples (x) 38 is quantized to introduces error that manifests itself as the quantization distortion. Referring to FIG. 1 and 2, a group of samples (x) 38 that are all different may be quantized to the same quantization level A(i) 34 by coming within the quantization interval 36 of a particular quantization level A(i) 34. As such, the group of samples (x) 38 encoded by the encoder 22 are all represented by the quantization level A(i) 34 in the bit-stream signal 26. When the decoder 24 subsequently decodes the bit-stream signal 26, the samples (x) 38 in the group are no longer different. The loss of the difference in the samples (x) 38 in the reconstructed signal 28 is the quantization distortion. Since comparison of the reconstructed signal 28 to the signal 18 is unavailable at the decoder 24, the actual quantization distortion is unknown. However, using the distortion removal system 16, the expected quantization distortion may be estimated and removed.

Figure 3:
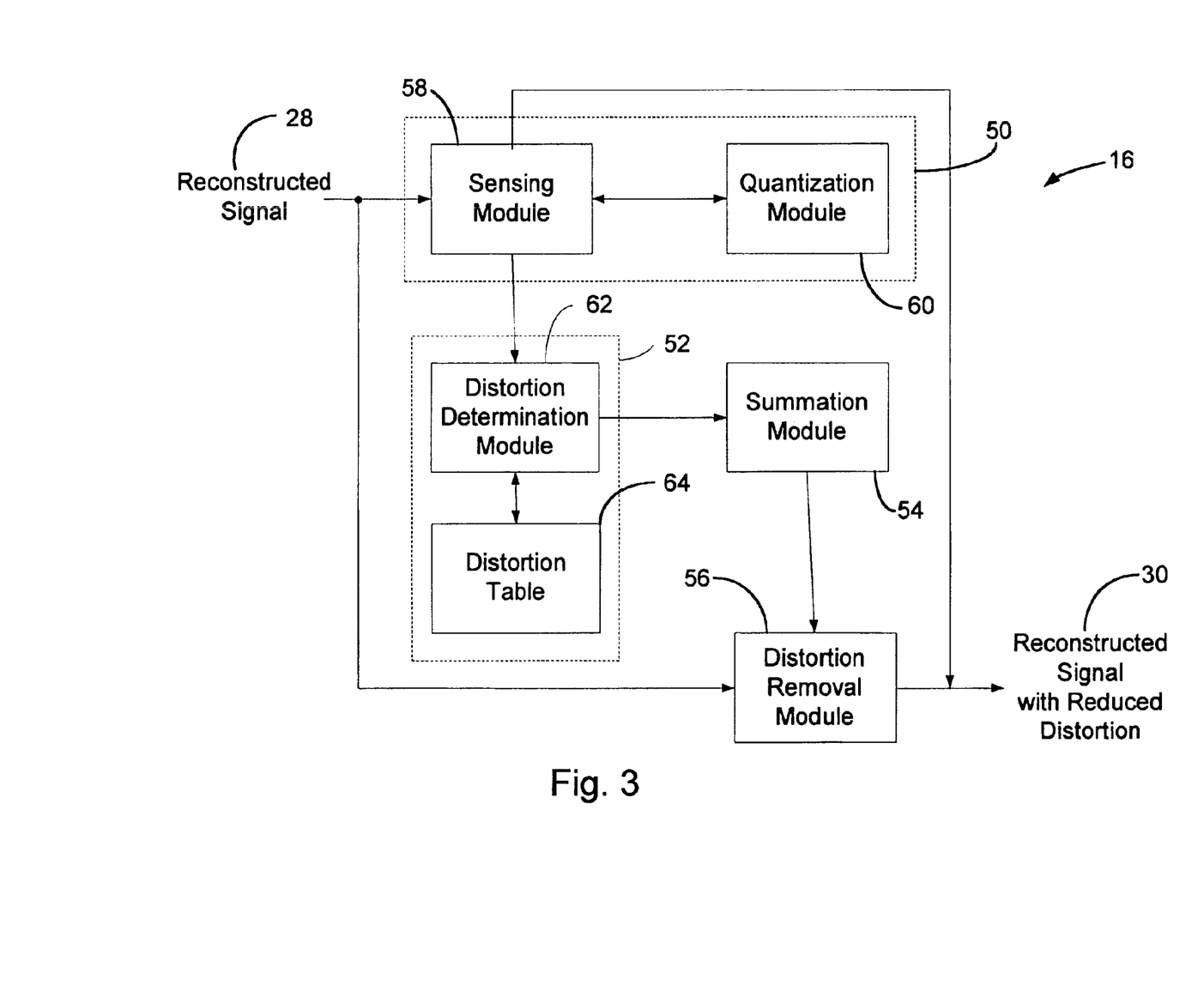
FIG. 3 is an expanded block diagram of one embodiment of the distortion removal system illustrated in FIG. 1.

FIG. 3 illustrates a block diagram of one embodiment of the distortion removal system 16. The distortion removal system 16 includes an initial processing module 50, a distortion identification module 52, a summation module 54 and a distortion removal module 56 logically interconnected as illustrated. An embodiment of the distortion removal system 16 may be implemented in a Digital Signal Processing (DSP) chip or other device having signal processing capability. The DSP chip may be programmed with some form of source code representing the distortion removal system 16. The distortion removal system 16 may receive the reconstructed signal 28 at the initial processing module 50.

One embodiment of the initial processing module 50 includes a sensing module 58 and a quantization module 60. The sensing module 58 provides the initial identification and processing of the reconstructed signal 28. The sensing module 58 may determine if the reconstructed signal 28 has been previously subject to quantization by a sample-by-sample quantizer. The determination is based on identifying the quantization levels of the reconstructed signal 28. If the sensing module 58 determines that a sample-by-sample quantizer did not previously quantize the reconstructed signal 28, the reconstructed signal 28 is not further processed by the distortion removal system 16. Alternatively, if the reconstructed signal 28 was subject to quantization by a sample-by-sample quantizer, the sensing module 58 may activate the remainder of the distortion removal system 16.

The sensing module 58 activates portions of the distortion removal system 16 based on whether the quantization levels are initially identifiable within the reconstructed signal 28. In one embodiment, the distortion removal system 16 may, for example, be part of the pre-processing of the reconstructed signal 28 prior to encoding with a different coder, such as a G.729 coder as described by ITU-T recommendation G.729. In this embodiment, the distortion removal system 16 may receive the reconstructed signal 28 in the time domain. Where the reconstructed signal 28 was, for example, previously encoded and decoded with G.711. The reconstructed signal 28 received by the distortion removal system 16 may be analyzed by the sensing module 58 to determine the type of sample-by-sample quantizer that previously quantized the reconstructed signal 28.

Determination of the sample-by-sample quantizer may occur by confirming the values of the samples of the reconstructed signal 28 "fit" within the values that could be produced by a particular sample-by-sample quantizer. As known in the art, each type of sample-by-sample quantizer indirectly includes a corresponding quantization table containing predetermined quantization levels identified by indices. As such, samples previously quantized by a particular quantizer can be used to identify that quantizer. Following identification of the type of sample-by-sample quantizer, the reconstructed signal 28 may be quantized again using the quantization module 60.

The quantization module 60 may include quantizers and corresponding quantization levels for any number of different sample-by-sample quantization techniques. An example of a quantizer and corresponding quantization levels is the G.711 A-law sample-by-sample quantizer. The sensing module 58 may direct the re-quantization of the reconstructed signal 28. Re-quantization of the reconstructed signal 28 by the quantization module 60 may provide the quantization levels. The identified quantization levels may be passed to the distortion identification module 52.

In an alternative embodiment, the distortion removal system 16 may be added as a post-processing module to a decoder, such as a G.711 A-law and μ-law decoder. In this alternative embodiment, the distortion removal system 16 may be provided the indices identifying the quantization levels of the reconstructed signal 28. As such, the initial processing module 50 may be unnecessary, and the distortion identification module 52 may obtain the quantization levels of the reconstructed signal 28 without additional processing.

In one embodiment, the distortion identification module 52 includes a distortion determination module 62 and a distortion table 64. The distortion determination module 62 is activated by the sensing module 58 to receive the quantization levels. The distortion determination module 62 may use the quantization levels to determine the corresponding expected quantization distortion from the distortion table 64.

The distortion table 64 of one embodiment includes the quantization levels and a corresponding expected quantization distortion for at least one sample-by-sample quantization technique. Each of the expected quantization distortion values may be a predetermined value. The predetermined values are an estimate of what the "real" quantization distortion may be for samples that were previously quantized to a particular quantization level. The "real" quantization distortion of a large number of samples quantized to a certain quantization level will converge towards the expected quantization distortion as the length of the frame (i.e. the number of samples) increases. By previously observing a frame of a reconstructed signal 28 that has been subject to sample-by-sample quantization, the expected quantization distortion may he estimated.

In an alternative embodiment, the distortion table 64 may be replaced by calculation of an expected quantization distortion for a given sample. In this alternative embodiment, the expected quantization distortion values are calculated as the samples in a frame are being processed. Calculations are performed for each sample in the frame using the previously discussed equations to determine the expected quantization distortion.

Referring now to FIGS. 2 and 3, the "real" quantization distortion from a quantization level A(i) 34 is a stochastic or random variable that may be given by:

$$Y(i) = (x_i - A(i))^2, \quad \text{Equation 5}$$

where Y(i) is the quantization distortion of a particular quantization level A(i) 34 and $x_i$ is the sample (x) 38 prior to quantization. An example embodiment for determining the expected quantization distortion E{Y(i)} for a particular quantization level A(i) 34 is derived from Equation 5 as:

$$E\{Y(i)\} = E\{(x(i) - A(i))^2\}, \quad \text{Equation 6}$$

which, using Equation 2 can be rewritten as:

$$= \int_{-\infty}^{\infty} (x(i) - A(i))^2 f(x(i)) \partial x(i),$$

$$= \int_{A_l(i)}^{A_u(i)} (x(i) - A(i))^2 \frac{1}{A_u(i) - A_l(i)} \partial x(i),$$

$$= \int_{A_l(i)}^{A_u(i)} \frac{1}{A_u(i) - A_l(i)} (x(i)^2 - A(i)^2 - 2x(i)A(i)) \partial x(i),$$

$$= \frac{1}{A_u(i) - A_l(i)} \left[ \frac{1}{3} x(i)^3 + A(i)^2 x(i) - A(i)x(i)^2 \right]_{x(i)=A_l(i)}^{x(i)=A_u(i)},$$

$$= \frac{1}{A_u(i) - A_l(i)} \left[ \frac{1}{3} (A_u(i)^3 - A_l(i)^3) + A(i)^2 (A_u(i) - A_l(i)) - A(i)(A_u(i)^2 - A_l(i)^2) \right]$$

$$= \frac{1}{3} (A_u(i)^2 + A_l(i)^2 + A_u(i)A_l(i)) + A(i)^2 - A(i)(A_u(i) + A_l(i)),$$

$$= A(i)(A(i) - A_l(i) - A_u(i)) + \frac{1}{3} (A_u(i)^2 + A_l(i)^2 + A_u(i)A_l(i)).$$

Equation 6 represents the expected quantization distortion for a particular quantization level A(i) 34 based on the value of the quantization level and the upper and lower boundaries 42 and 44. Quantization of a series of samples (x) 38 in a frame may result in the "real" quantization distortion given by a stochastic variable Z:

$$Z = \sum_{n=1}^{N} Y(i)(n), \quad \text{Equation 7}$$

where N is the number of samples (x) 38 in a frame, Y(i) is provided by Equation 5 and n represents the time index in the frame. Accordingly, the expected quantization distortion from a series of samples (x) 38 that have been quantized is given by:

$$E\{Z\} = E\left\{\sum_{n=1}^{N} Y_i(n)\right\}, \quad \text{Equation 8}$$

where Y(i) from Equation 5 is notated as $Y_i$ and can be rewritten as:

$$= \sum_{n=1}^{N} E\{Y_i(n)\}.$$

Using Equation 6, Equation 8 may be rewritten as:

$$= \sum_{n=1}^{N} A_i(n)(A_i(n) - A_{li}(n) - A_{ui}(n)) + \quad \text{Equation 9}$$

$$\frac{1}{3}(A_{ui}(n)^2 + A_{li}(n)^2 + A_{ui}(n)A_{li}(n)).$$

Equation 9 is a mathematical representation of the expected quantization distortion for a series of samples (x) 38 that may form a frame. Thus, the expected quantization distortion introduced by the previous quantization of a frame of the signal 18 (FIG. 1) can be estimated from the reconstructed signal 28 that was previously quantized. The energy of the expected quantization distortion ($e_q(n)$) can be estimated by:

$$Ee_q(n) = \sum_{n=1}^{N} x_q(n)(x_q(n) - A_l(x_q(n)) - A_u(x_q(n))) + \quad \text{Equation 10}$$

$$\frac{1}{3}(A_u(x_q(n))^2 + A_l(x_q(n))^2 +$$

$$A_u(x_q(n))A_l(x_q(n)))$$

Where $x_q(n)$ is a particular quantized sample ($x_q$) 40 and $A_l(x_q(n))$ and $A_u(x_q(n))$ denote the upper and lower boundaries 42 and 44 of the quantization level A(i) 34 for the particular quantized sample ($x_q$) 40. The reader should note that $x_q(n)$ in Equation 10 is equal to the quantization level A(i) 34 and illustrates that a particular sample (x) 38 in the frame was previously quantized to a particular quantization level A(i) 34. Accordingly, the value of the expected quantization distortion may be estimated from the frame of the reconstructed signal 28.

Referring again to FIG. 3, the values of the expected quantization distortion for each quantization level may be stored in the distortion table 64. During operation, the distortion determination module 62 may identify the value of the expected quantization distortion that corresponds to the quantization level for a particular sample in a frame. The expected quantization distortion may be extracted from the distortion table 64 and provided by the distortion determination module 62 to the summation module 54.

The summation module 54, of one embodiment, is operable to sum the expected quantization distortion for the entire frame. The expected quantization distortion for each sample is summed to one value representative of the expected quantization distortion for the frame. In addition, the summation module 54 may also estimate a spectral shape of the expected quantization distortion for the frame. The spectral shape may be used to determine the magnitude spectrum of the expected quantization distortion for the frame.

The spectral shape may be determined based on the error criterion utilized during encoding by the sample-by-sample quantizer. The distribution in frequency is referred to as "flat" when the "real" quantization distortion produced by the error criterion is similar for all frequencies. When the distortion is similar for all frequencies, the distortion may be referred to as "white noise." An assumption that the spectral shape of the "real" quantization distortion is flat may be made when using error criterion such as the G.711 criterion or the mean square error (MSE) criterion for encoding. The magnitude spectrum for the expected quantization distortion in the frequency domain when the error criterion used by the encoder results in a flat spectral shape, may be given by:

$$|\tilde{E}_q(f)| = \sqrt{Ee_{q(n)}} \text{ for all frequencies } (f). \quad \text{Equation 11}$$

The spectrum may be other than flat, and the spectral shape that is created by the error criterion may require revision of Equation 11 to include a function to reflect the frequency dependency.

The summation module 54 may also determine a phase spectrum of the expected quantization distortion. In one embodiment, the phase spectrum of the expected quantization distortion is assumed to be equal to the phase spectrum of the reconstructed signal 28. As such, the magnitude and the phase spectrum of the expected quantization distortion for the frame is determined by the summation module 54 and passed to the distortion removal module 56. This solution assumes the phase spectrum of the quantization noise correlates with the phase spectrum of the quantized signal. In alternative embodiments it may be appropriate to assume only a certain degree of correlation between the phase spectrum of the quantized signal and the quantization noise. In these alternative embodiments, information regarding the phase spectrum may be determined similar to the determination of a phase spectrum of environmental (background) noise in the field of noise suppression.

Referring again to FIGS. 1, 2 and 3, the distortion removal module 56 of one embodiment is operable to remove the expected quantization distortion from the frame. The distortion removal module 56 may receive the expected quantization distortion for the frame from the summation module 54. In addition, the distortion removal module 56 may also receive the frame of the reconstructed signal 28.

Removal of the expected quantization distortion from the reconstructed signal 28 may occur in either the time domain or the frequency domain. The previously discussed sample-by-sample quantization technique may be generally represented in the time domain by:

$$x_q(n) = x(n) + e_q(n), \quad \text{Equation 12}$$

where $x_q(n)$ is the quantized sample ($x_q$) 40, and $e_q(n)$ is the quantization distortion in the time domain of the sample (x) 38 represented by x(n). The equivalent frequency domain representation of this process is:

$$X_q(f) = X(f) + E_q(f). \quad \text{Equation 13}$$

As previously discussed, the previously quantized reconstructed signal 28 (represented by $X_q(f)$ in Equation 13) is available to the distortion removal system 16. As such, Equation 13 may be rewritten to determine the spectrum of the signal 18 prior to quantization by the sample-by-sample quantizer 32. Removal of the expected quantization distortion from the spectrum of the reconstructed signal 28 may be accomplished by:

$$X(f) = X_q(f) - E_q(f). \quad \text{Equation 14}$$

Accordingly, based on Equations 13 and 14, an estimate of the spectrum of the signal 18 prior to quantization by the sample-by-sample quantizer 32 may be obtained using the reconstructed signal 28 that was subject to quantization by the sample-by-sample quantizer 32. The resulting reconstructed signal with reduced distortion 30 in the frequency domain(represented by $\tilde{X}(f)$) is given by:

$$\tilde{X}(f) = X_q(f) - \tilde{E}_q(f). \qquad \text{Equation 15}$$

Figure 4:
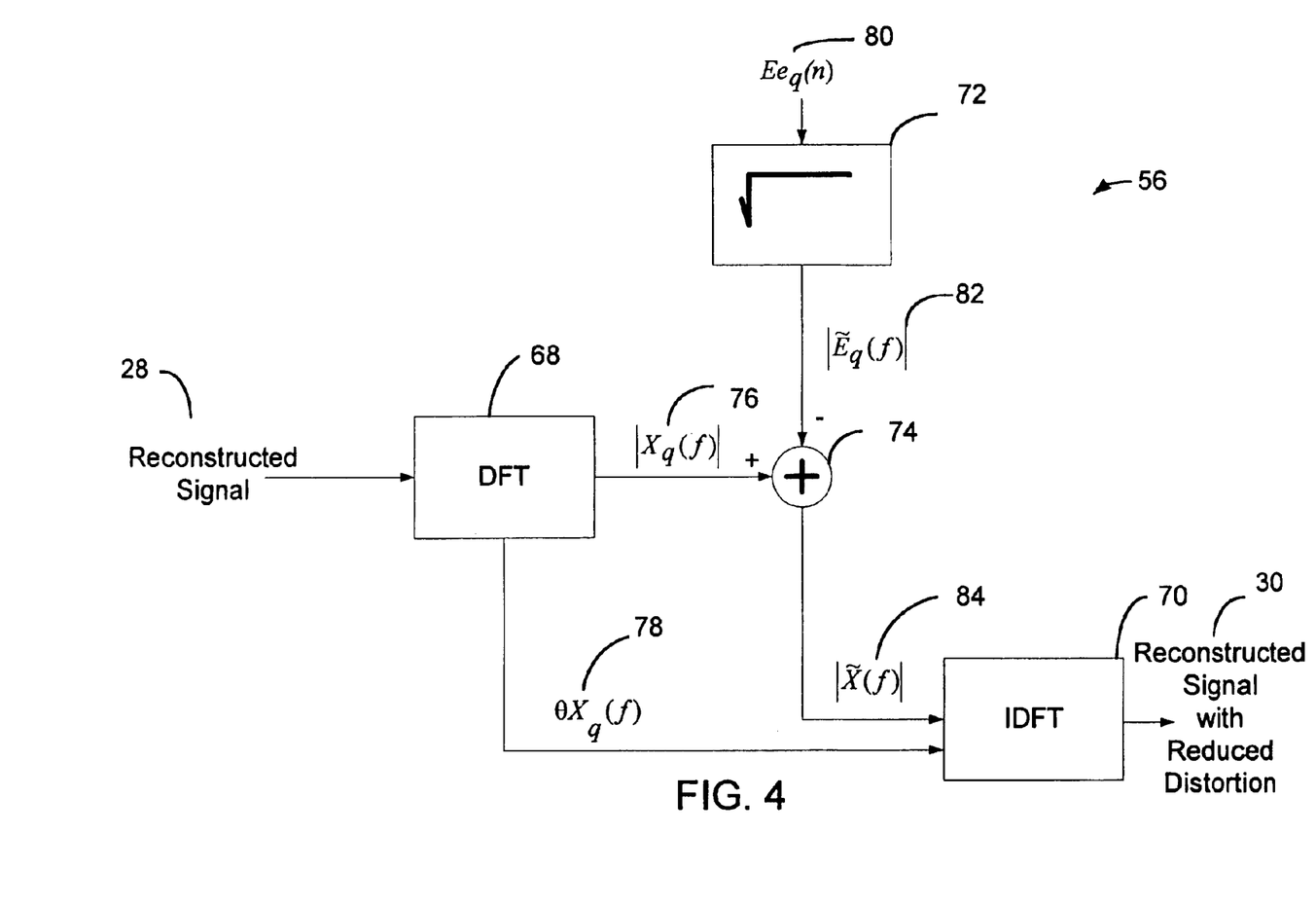
FIG. 4 is an expanded block diagram of one embodiment of a distortion removal module illustrated in FIG. 3.

FIG. 4 is a block diagram representation of one embodiment of the distortion removal module 56 illustrated in FIG. 3. The distortion removal module 56 includes a discrete Fourier transformation module (DFT) 68, an inverse discrete Fourier transformation module (IDFT) 70, a square root module 72 and a subtractor module 74 that may be logically interconnected as illustrated. In this embodiment, expected quantization distortion is removed from the reconstructed signal 28 in the frequency domain to obtain the reconstructed signal with reduced distortion 30.

The discrete Fourier transformation module (DFT) 68 may provide discrete Fourier transformation of signals provided in the time domain. In general, Fourier transformation involves determining the complex spectrum of N samples x(n) in a frame by:

$$X(f) = \sum_{n=0}^{N-1} x(n) e^{-j2\pi \cdot k \cdot n/N}, \qquad \text{Equation 16}$$

where k is the frequencies at which the spectrum is evaluated and may be given by:

$$f = \frac{2\pi k}{n},$$

k=0, 1, . . . , N−1 and j is the imaginary unit. The magnitude spectrum ($|X(f)|$) at frequency (f) may given by:

$$|X(f)| = \sqrt{X(f) \cdot X^*(f)} = \sqrt{\text{Re}(X(f))^2 + \text{Im}(X(f))^2}, \qquad \text{Equation 17}$$

and the phase spectrum ($\theta X(f)$) may be given by:

$$\theta X(f) = \arctan \frac{\text{Im}(X(f))}{\text{Re}(X(f))}. \qquad \text{Equation 18}$$

Similarly, the inverse discrete Fourier transformation module (IDFT) 70 may provide the inverse Fourier transformation of signals provided in the frequency domain. In general, inverse Fourier transformation involves the using the magnitude spectrum ($|X(f)|$) and the phase spectrum ($\theta X(f)$) to determine the complex spectrum (X(f)) by:

$$X(f) = |X(f)| e^{j\theta X(f)}. \qquad \text{Equation 19}$$

Where the inverse Fourier transformation to the time domain of the complex spectrum (X(f)) of N samples in a frame is given by:

$$x(n) = \frac{1}{N} \sum_{k=0}^{N-1} X(f) e^{j2\pi \cdot k \cdot n/N} \qquad \text{Equation 20}$$

Referring to FIG. 4, the removal of the expected quantization distortion in the frequency domain will now be explained. The discrete Fourier transformation module (DFT) 68 receives the reconstructed signal 28. The reconstructed signal 28 comprises the quantized samples ($x_q$) 40 in the time domain as previously represented by $x_q(n)$ in Equation 12. The discrete Fourier transformation module (DFT) 68 converts the quantized samples $x_q(n)$ to a magnitude spectrum of the quantized samples ($|X_q(f)|$) 76 in the frequency domain using Equations 16 and 17. The discrete Fourier transformation module (DFT) 68 also generates a phase spectrum ($\theta X(f)$) 78 using Equation 18.

The square root module 72 may receive an expected quantization distortion ($Ee_q(n)$) 80 as previously discussed with reference to Equation 10. Equation 11 may be use to determine a magnitude spectrum of the expected quantization noise ($|\tilde{E}_q(f)|$) 82 from the expected quantization distortion ($Ee_q(n)$) 80. The subtractor module 74 performs spectral subtraction of the magnitude spectrum of the expected quantization noise ($|\tilde{E}_q(f)|$) 82 from the magnitude spectrum of the quantized samples ($|X_q(f)|$) 76.

The output of the subtractor module 74 is an estimate of the magnitude spectrum of the original signal $|\tilde{X}(f)|$ 84. The phase spectrum ($\theta X(f)$) 78 and the magnitude spectrum of the original signal $|\tilde{X}(f)|$ 84 are provided to the inverse discrete Fourier transformation module (IDFT) 70. The inverse discrete Fourier transformation module (IDFT) 70 may use the phase spectrum ($\theta X(f)$) 78 and the magnitude spectrum of the original signal $|\tilde{X}(f)|$ 84 to calculate the reconstructed signal with reduced distortion 30 in the time domain.

The reconstructed signal with reduced distortion 30 may be determined in the frequency domain based on Equation 15. Equation 15 may be expanded into a phase representation and a magnitude representation based on Equation 19 to be:

$$\tilde{X}(f) = |X_q(f)| e^{j\theta X_q(f)} - |\tilde{E}_q(f)| e^{j\theta E_q(f)}. \qquad \text{Equation 21}$$

Assuming the phase spectrum of the expected quantization distortion is equal to the phase spectrum of the reconstructed signal 28 as previously discussed, Equation 21 may be rewritten as:

$$\tilde{X}(f) = |X_q(f)| e^{j\theta X_q(f)} - |\tilde{E}_q(f)| e^{j\theta X_q(f)}. \qquad \text{Equation 22}$$

Which may be further rewritten as:

$$\tilde{X}(f) = (|X_q(f)| - |\tilde{E}_q(f)|) e^{j\theta X_q(f)}. \qquad \text{Equation 23}$$

The reconstructed signal with reduced distortion 30 may be determined in the time domain (as represented by $\tilde{x}(n)$) from the frequency domain parameters using Equations 20 and 23 as given by:

$$\tilde{x}(n) = \frac{1}{N} \sum_{k=0}^{N-1} (|X_q(f)| - |\tilde{E}_q(f)|) e^{j\theta X_q(f)} \cdot e^{j2\pi \cdot k \cdot n/N}. \qquad \text{Equation 24}$$

Figure 5:
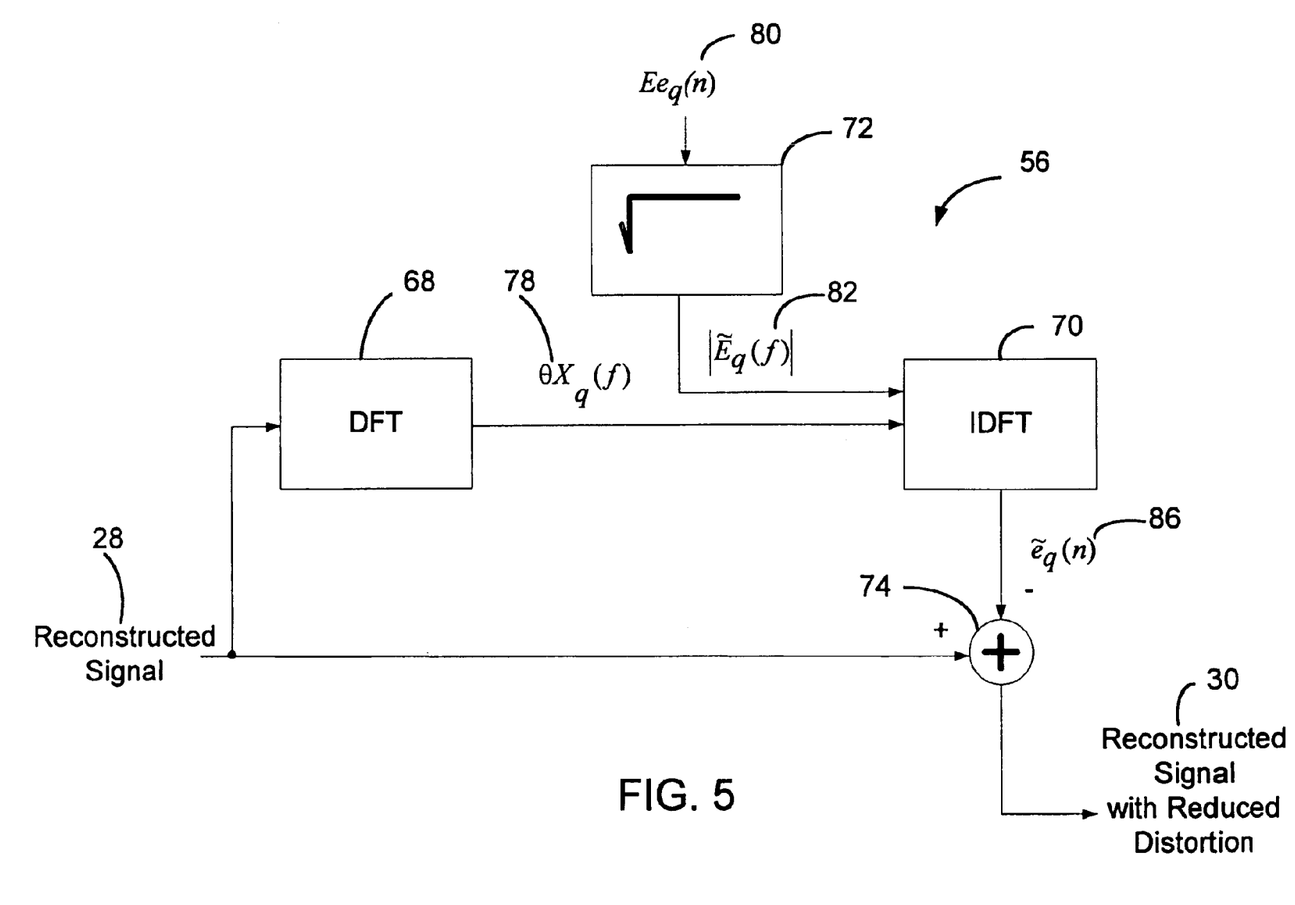
FIG. 5 is an expanded block diagram of another embodiment of a distortion removal module illustrated in FIG. 3.

FIG. 5 is a block diagram representation of another embodiment of the distortion removal module 56 illustrated in FIG. 3. The distortion removal module 56 includes a discrete Fourier transformation module (DFT) 68, an inverse discrete Fourier transformation module (IDFT) 70, a square root module 72 and a subtractor module 74 that may be logically interconnected as illustrated. In this embodiment, expected quantization distortion is removed from the reconstructed signal 28 in the time domain to obtain the reconstructed signal with reduced distortion 30.

During operation, the reconstructed signal 28 is provided to the discrete Fourier transformation module (DFT) 68 and the subtractor 74. The discrete Fourier transformation module (DFT) 68 may determine the phase spectrum ($\theta X(f)$) 78 as in the previously discussed embodiments. In an alternative embodiment, the phase spectrum ($\theta X(f)$) 78 may be available due to other processing of the reconstructed signal 28 thereby making the discrete Fourier transformation module (DFT) 68 unnecessary. The phase spectrum (θX(f)) 78 is provided to the inverse discrete Fourier transformation module (IDFT) 70.

The inverse discrete Fourier transformation module (IDFT) 70 also receives the magnitude spectrum of the expected quantization noise ($|\tilde{E}_q(f)|$) 82 from the square root module 72. The magnitude spectrum of the expected quantization noise ($|\tilde{E}_q(f)|$) 82 may be determined similar to the previously discussed embodiments. Inverse Fourier transformation of the phase spectrum (θX(f)) 78 and the magnitude spectrum of the expected quantization noise ($|\tilde{E}_q(f)|$) 82 provides an expected quantization noise $\tilde{e}_q$ (n) 86 in the time domain. Subtraction of the expected quantization noise $\tilde{e}_q(n)$ 86 from the reconstructed signal 28 is performed by the subtractor 74. As previously discussed, the reconstructed signal 28 is represented by the quantized samples $x_q(n)$ in a frame. Subtraction in the time domain provides the reconstructed signal with reduced distortion 30 (represented by $\tilde{x}(n)$) as given by:

$$\tilde{x}(n) = x_q(n) - \tilde{e}_q(n). \quad \text{Equation 25}$$

Which may be rewritten using Equation 20 as:

$$\tilde{x}(n) = x_q(n) - \frac{1}{N}\sum_{k=0}^{N-1}|\tilde{E}_q(f)|e^{j\theta X_q(f)} \cdot e^{j2\pi \cdot k \cdot n/N}. \quad \text{Equation 26}$$

Figure 6:
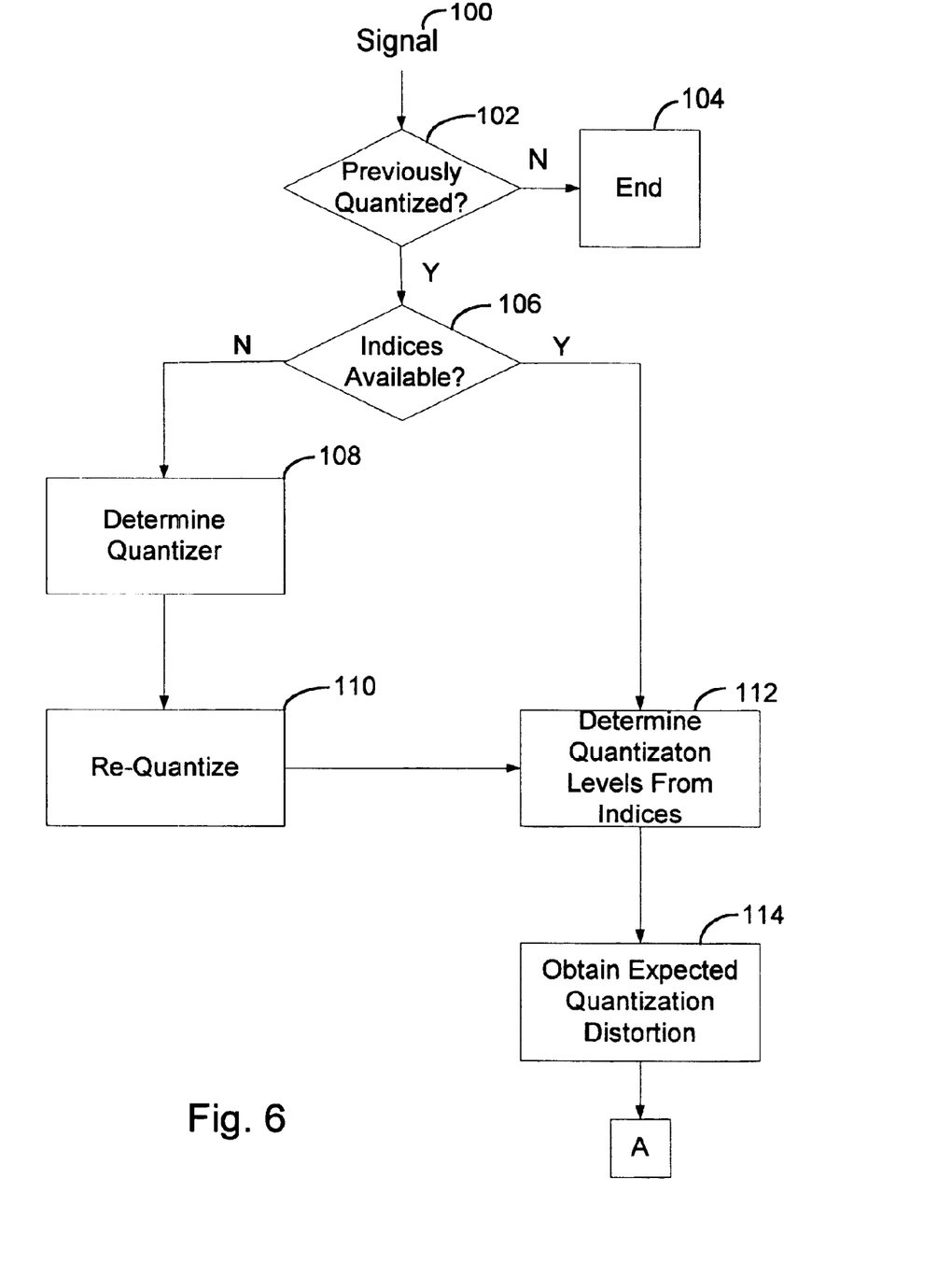
FIG. 6 is a first part of a flow diagram representing operation of one embodiment of a distortion removal system.
Figure 7:
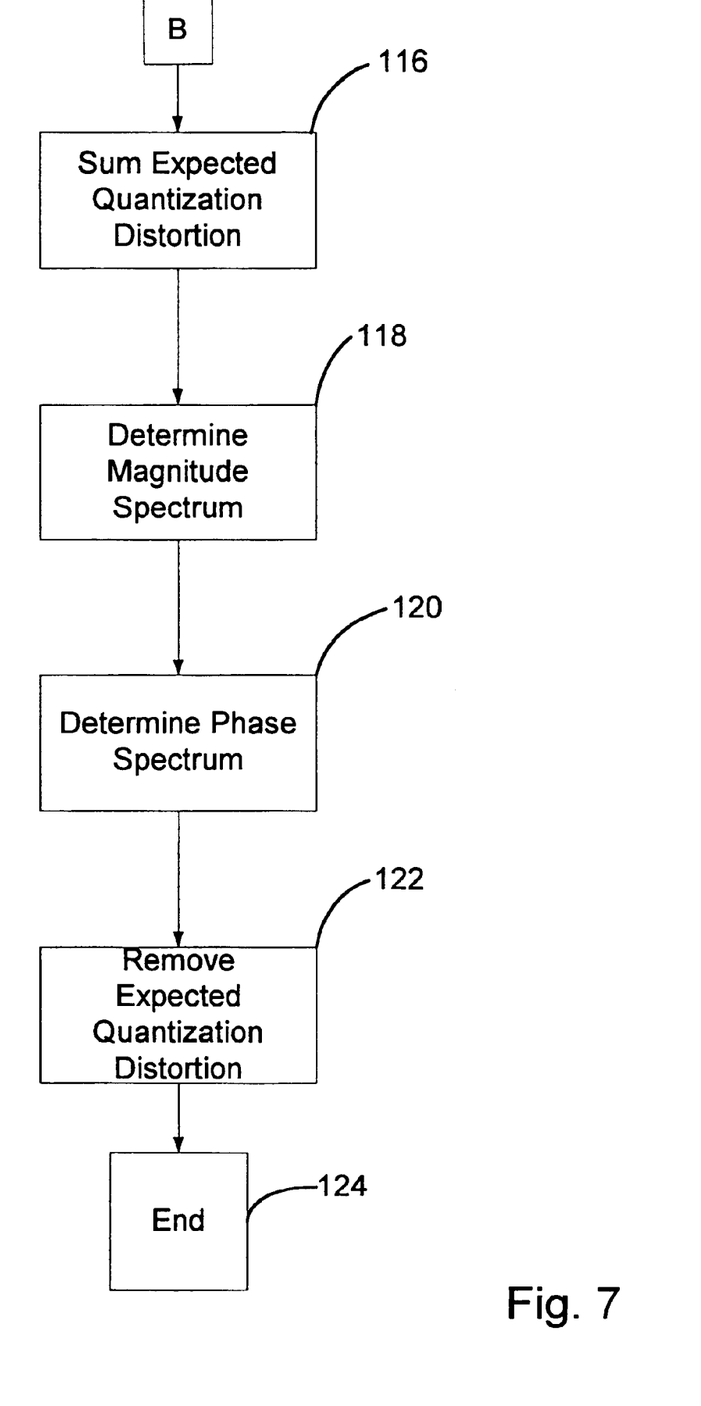
FIG. 7 is a second part of a flow diagram representing operation of one embodiment of a distortion removal system.

FIGS. 6 and 7 are flow diagrams depicting operation of one embodiment of the distortion removal system 16 illustrated in FIG. 3. As illustrated in FIG. 6, a signal 100 is received by the distortion removal system 16. At block 102, analysis of the signal 100 occurs to determine if the signal 100 has been previously subject to quantization by a sample-by-sample quantizer. If the signal 100 has not been previously quantized, processing ends at block 104, and the signal 100 is unmodified by the distortion removal system 16.

Alternatively, if the signal 100 has been previously quantized, an estimation of the expected quantization distortion is initiated by determining whether the indices are available directly from the signal 100 at block 106. As previously discussed, when the distortion removal system 16 is used as a post-processing module, the indices may be available without additional processing. If the indices are not available, the type of sample-by-sample quantizer previously used with the signal 100 is determined at block 108. Following identification of the type of quantizer, the signal 100 is re-quantized at block 110 to reveal the indices. When the indices are available at either block 110 or block 106, the quantization levels are determined from the indices at block 112. Using the quantization levels, the expected quantization distortion is obtained from the distortion table at block 114 for each sample in a frame of the signal 100.

Referring now to FIG. 7, the expected quantization distortion is summed at block 116 to represent the expected quantization distortion for each frame. The expected quantization distortion is an estimate of the actual quantization distortion present in each frame of the signal 100. At block 118, the magnitude spectrum of the expected quantization distortion for each frame is determined. As previously discussed, the shape of the magnitude spectrum is determined based on the error criterion used during quantization, while the summed expected quantization distortion in block 116 determines the level of the magnitude spectrum. If the indices were not available at block 106, the error criterion is determined when the quantizer is identified at block 108. On the other hand, if the indices were available at block 106, the error criterion is inherently available since the signal 100 is subject to decoding following removal of the expected quantization distortion.

Following determination of the magnitude spectrum at block 118, the phase spectrum is determined at block 120 based on the signal 100. At block 122, the expected quantization distortion for each frame is removed from the signal 100 in either the time domain or the frequency domain. Following processing at block 122, operation of the distortion removal system 16 ends at block 124 and the reconstructed signal with reduced distortion 30 (FIG. 3) is provided by the distortion removal system 16.

In the previously discussed embodiments, the expected quantization distortion is determined by the distortion removal system 16 based on the reconstructed signal 28. Accordingly, the distortion removal system 16 may be added as a post-processing module or as a pre-processing module to an existing coder 12 without changes to the existing encoder 22 or decoder 24. The distortion removal system 16 may significantly improve the quality of any signal 18 previously subject to quantization with a sample-by-sample quantizer.

The embodiments have been discussed with reference to functional blocks identified as modules that are not intended to represent discrete structures and may be combined or further sub-divided in various embodiments as known in the art. In addition, while various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method of reducing a quantization distortion created by quantization of a speech signal by a sample-by-sample quantizer, the speech signal including a plurality of frames, the method comprising:

detecting that one frame of the plurality of frames was previously quantized;

determining a quantization level for each of a plurality of samples of the one frame;

estimating an expected quantization distortion for each of the plurality of samples based on the quantization level of each of the plurality of samples;

summing up the expected quantized distortion of each of the plurality of samples to generate a summed quantization distortion; and removing the summed quantization distortion from the frame.

2. The method of claim 1, wherein the determining includes using quantization indices to determine the quantization levels.

3. The method of claim 2, wherein the quantization indices are obtained by analyzing the frame to determine a type of the sample-by-sample quantizer and requantizing the frame.

4. The method of claim 1 where the reduction of the quantization distortion is part of the pre-processing of the signal prior to encoding.

5. The method of claim 1 where the reduction of the quantization distortion is part of the post-processing of the signal following decoding.

6. The method of claim 1, wherein the removing is performed in the frequency domain.

7. The method of claim 1, wherein the removing is performed in the time domain.

8. A method of reducing quantization distortion created by a sample-by-sample quantizer, the method comprising:

(a) determining quantization levels of a frame of a previously quantized signal;

(b) estimating an expected quantization distortion for each of the quantization levels;

(c) summing the expected quantization distortion for the frame of the previously quantized signal; and (d) removing the expected quantization distortion from the frame.

9. The method of claim 8 where (b) further comprises determining the distribution of the signal quantized to each of the quantization levels and storing the expected quantization distortion in a distortion table.

10. The method of claim 8 where (c) further comprises assuming a magnitude spectrum of the expected quantization distortion is flat and assuming a phase spectrum of the expected quantization distortion is the same as the signal.

11. The method of claim 8 further comprising initially determining if a signal has been subject to quantization by the sample-by-sample quantizer.

12. The method of claim 11 further comprising executing the remainder of the method if the signal has been subject to quantization by the sample-by-sample quantizer.

13. The method of claim 11 further comprising determining a type of sample-by-sample quantization.

14. The method of claim 8 where (a) further comprises quantizing the signal with a sample-by-sample quantizer prior o determining the quantization levels.

15. The method of claim 8 where (d) further comprises removing the expected quantization distortion in the frequency domain.

16. The method of claim 8 where (d) further comprises removing the expected quantization distortion in the time domain.

17. A method of estimating quantization distortion for a frame of a signal that has been quantized using sample-by-sample quantization, the method comprising:

(a) determining the distribution of the signal within a plurality of quantization levels;

(b) estimating an expected quantization distortion for each of the quantization levels based on the distribution;

(c) determining an expected quantization distortion for the frame as a function of the expected quantization distortion of each of the quantization levels;

(d) determining a phase spectrum of the expected quantization distortion of the frame.

18. The method of claim 17 further comprising (e) determining a spectral shape of the expected quantization distortion of the frame as a function of an error criterion used during the sample-by-sample quantization.

19. The method of claim 18 further comprising (f) approximating the spectral shape of the expected quantization distortion of the frame as flat.

20. The method of claim 17 further comprising (e) assuming that the phase spectrum of the expected quantization distortion of the frame is equal to the phase spectrum of the frame.

21. The method of claim 17 where (b) further comprises determining an upper boundary and a lower boundary for each of the quantization levels.

22. A method of reducing the quantization distortion created during quantization of a signal by a sample-by-sample quantizer, where a frame of the signal comprises a plurality of samples that are quantized to one of a plurality of quantization levels by the sample-by-sample quantizer, the method comprising:

(a) receiving the frame of the signal;

(b) identifying the quantization level of each of the samples;

(c) obtaining the expected quantization distortion of each of the samples;

(d) summing the expected quantization distortion of each of the quantization levels of the frame; and (e) removing the sum of the expected quantization distortion from the frame.

23. The method of claim 22 further comprising initially determining if the frame was previously quantized.

24. The method of claim 22 where (a) comprises receiving the signal with a base station.

25. The method of claim 22 where (a) comprises receiving the signal with a mobile communication device.

26. The method of claim 22 where (a) comprises receiving the signal with a public switched telephone network.

27. The method of claim 22 where (a) comprises receiving the signal from a communication medium.

28. The method of claim 22 where (a) comprises receiving the signal with a packet-based network.

29. The method of claim 22 where (c) further comprises determining a distribution of the samples within the quantization levels.

30. The method of claim 22 where (d) further comprises determining a magnitude spectrum of the expected quantization distortion, and determining a phase spectrum of the expected quantization distortion.

31. The method of claim 22 where the quantization levels are obtained from the signal without additional processing.

32. The method of claim 22 where (b) further comprises re-quantizing the signal.

33. The method of claim 22 where (c) further comprises retrieving the expected quantization distortion from a distortion table.

34. The method of claim 22 where (e) further comprises removing the expected quantization distortion in the frequency domain.

35. The method of claim 22 where (e) further comprises removing the expected quantization distortion in the time domain.

36. A distortion removal system for a frame of a signal that includes quantization distortion resulting from the frame being previously quantized to a plurality of quantization levels by a sample-by-sample quantizer, the distortion removal system comprising:

a distortion identification module operable to identify an expected quantization distortion for each of the quantization levels in the frame;

a summer module operable to sum the expected quantization distortion; and a distortion removal module operable to remove the summed expected quantization distortion.

37. The distortion removal system of claim 36 further comprising an initial processing module operable to determine and provide the quantization levels to the distortion identification module.

38. The distortion removal system of claim 37 where the initial processing module further comprises a sensing module and a quantization module.

39. The distortion removal system of claim 36 where the distortion identification module comprises a distortion determination module and a distortion table.

40. The distortion removal system of claim 36 where the distortion removal system is operable to pre-process the signal prior to encoding.

41. The distortion removal system of claim 36 where the distortion removal system is operable to post-process the signal following decoding.

42. The distortion removal system of claim 36 where the distortion removal module is operable to remove the expected quantization distortion in the frequency domain.

43. The distortion removal system of claim 36 where the distortion removal module is operable to remove the expected quantization distortion in the time domain.

* * * * *

UNITED STATES PATENT AND TRADEMARK OFFICE
CERTIFICATE OF CORRECTION

PATENT NO. : 7,164,719 B2
APPLICATION NO. : 09/733567
DATED : January 16, 2007
INVENTOR(S) : Jes Thyssen It is certified that error appears in the above-identified patent and that said Letters Patent is hereby corrected as shown below:

In the claims, column 14, line 46, --one-- should be inserted immediately before "frame".

In the claims, column 14, line 50, "levels" should be changed to --level for each of a plurality of samples--.

In the claims, column 14, line 52, --one-- should be inserted immediately before "frame".

In the claims, column 14, line 54, --one-- should be inserted immediately before "frame".

In the claims, column 14, line 55, "the reduction of" should be changed to --reducing--.

In the claims, column 14, line 56, "part of the pre-processing" should be changed to --part of a pre-processing--.

In the claims, column 14, line 57, --speech-- should be inserted immediately before "signal".

In the claims, column 14, line 58, "the reduction of" should be changed to --reducing--.

In the claims, column 14, line 59, "part of the pre-processing" should be changed to --part of a pre-processing--.

In the claims, column 14, line 60, --speech-- should be inserted immediately before "signal".

In the claims, column 15, line 3, --each of the quantization levels for-- should be inserted immediately after "for".

In the claims, column 15, line 5, --summed-- should be inserted immediately before "expected".

In the claims, column 15, line 8, "determining the distribution of the signal quantized to each" should be changed to --determining a distribution of the previously quantized signal--.

In the claims, column 15, line 9, "of" should be changed to --within--.

UNITED STATES PATENT AND TRADEMARK OFFICE
CERTIFICATE OF CORRECTION

PATENT NO. : 7,164,719 B2
APPLICATION NO. : 09/733567
DATED : January 16, 2007
INVENTOR(S) : Jes Thyssen It is certified that error appears in the above-identified patent and that said Letters Patent is hereby corrected as shown below:

In the claims, column 15, line 13, --previously quantized-- should be inserted immediately before "signal".

In the claims, column 15, line 17, "claim 11" should be changed to --claim 10--.

In the claims, column 15, line 18, "the remainder of the method if the signal" should be changed to --the method after the initially determining if the signal--.

In the claims, column 15, line 23, "the" should be changed to --a--.

In the claims, column 15, line 24, "o" should be changed to --to--.

In the claims, column 15, line 33, "determining the" should be changed to --determining a--.

In the claims, column 15, line 62, "the quantization level" should be changed to --a quantization level--.

In the claims, column 15, line 64, "the" should be changed to --an--.

In the claims, column 15, line 67, "quantization levels of the frame" should be changed to --samples--.

In the claims, column 16, line 43, --of each of the quantization levels in the frame-- should be inserted immediately after "distortion".

Signed and Sealed this

Eighteenth Day of September, 2007

JON W. DUDAS
*Director of the United States Patent and Trademark Office*